United States Patent [19]

Ohno

[11] Patent Number: 5,654,934
[45] Date of Patent: Aug. 5, 1997

[54] SEMICONDUCTOR MEMORY EMPLOYING A BLOCK-WRITE SYSTEM

[75] Inventor: Kazuki Ohno, Tokyo, Japan

[73] Assignee: NEC Corporation, Tokyo, Japan

[21] Appl. No.: 691,396

[22] Filed: Aug. 2, 1996

[30] Foreign Application Priority Data

Aug. 30, 1995 [JP] Japan ................... 7-221880

[51] Int. Cl.$^6$ ................................................ G11C 8/04
[52] U.S. Cl. ........................... 365/233; 365/230.08
[58] Field of Search .................... 365/233, 230.08, 365/221

[56] References Cited

U.S. PATENT DOCUMENTS 5,202,857  4/1993  Yanaz et al. ..................... 365/233
5,539,696  7/1996  Patel ................................. 365/233

OTHER PUBLICATIONS

Samsung Electronics, Rev. 3, Aug. 1995, pp. 15–18.

*Primary Examiner*—David C. Nelms
*Assistant Examiner*—Michael T. Tran
*Attorney, Agent, or Firm*—Young & Thompson

[57] ABSTRACT

A semiconductor memory comprises a memory cell array having bit line pairs, a pair of I/O lines, column switches connected between the pair of I/O lines and an associated one of the bit line pairs, a timing signal generator generating a timing signal, an address latch circuit latching an address signal in response to the timing signal and a column decoder decoding the address signal latched into the address latch circuit to activate at least one of the column switches. The timing signal generator generates the timing signal synchronized with a clock signal during the normal write operation, and generates the timing signal having a lower frequency than the clock signal during the block-write operation.

9 Claims, 6 Drawing Sheets

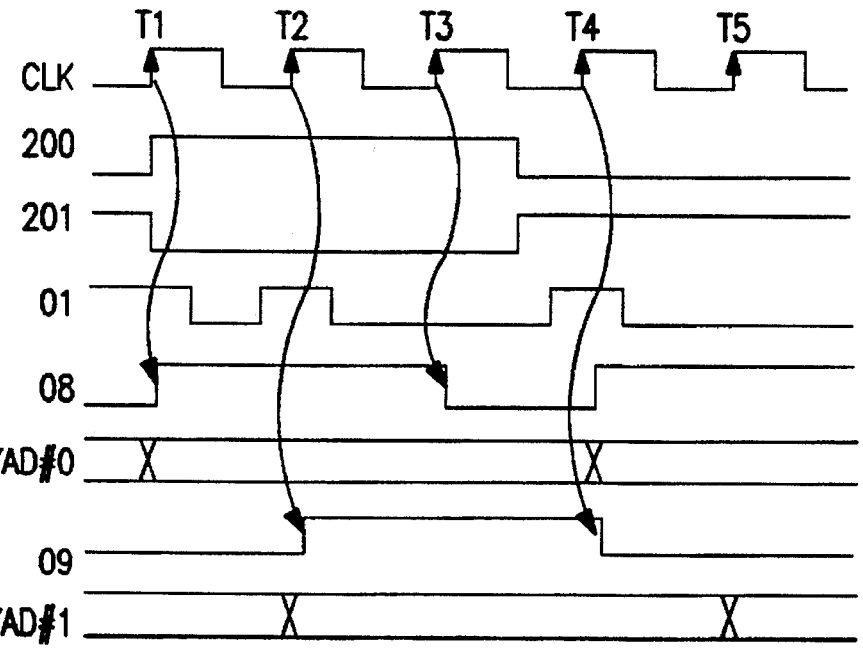
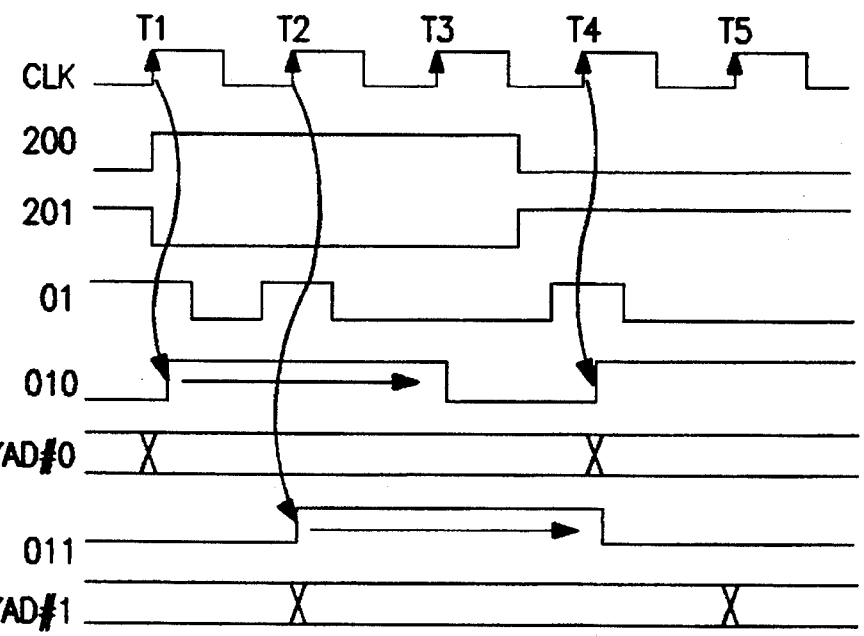

SEMICONDUCTOR MEMORY EMPLOYING A BLOCK-WRITE SYSTEM

BACKGROUND OF THE INVENTION

1. Field of the invention

The present invention relates to a semiconductor memory employing a block-write system, and more particularly to a semiconductor memory having a timing signal generator generating a block-write signal to prevent an internal address signal from changing during a block-write operation, and in which the semiconductor memory performs read/write operations synchronized with a clock signal supplied thereto.

2. Description of the Related Art

A semiconductor memory such as DRAM is often used for a video memory to storage video data which corresponds to characters or graphics to be displayed on a display device such as a CRT. To improve the write operation speed of the video memory, it has been proposed to use a block-write system which performs a block-write operation on a plurality (or "block") of memory cells simultaneously, because a plurality of memory cells having successive addresses in video memory often receive the same data. In video memory employing a block-write system, a plurality of column switches are activated simultaneously while a single word line is selected based on a row address at one write cycle, so that the same data is written simultaneously into a plurality of memory cells from a pair of I/O lines. Therefore the same data is written into a plurality of memory cells having successive addresses.

Since the block-write operation performs a writing operation simultaneously to a plurality of memory cells having mutually different column addresses, unlike the normal write operation, the operation requires more time for one operation compared with the normal write operation. Accordingly, if the cycle time of the normal write operation were shortened by increasing the frequency of the clock signal input to the memory, then a block-write operation might not be performed accurately because of insufficient processing time. In other words, a conventional semiconductor memory employing a block-write system cannot be used with a high-frequency clock signal, even if the normal write operation can be performed with such clock signal.

SUMMARY OF THE INVENTION

It is, therefore, an object of the present invention to provide an improved semiconductor memory employing a block-write system.

It is another object of the present invention to provide a semiconductor memory employing a block-write system, in which the semiconductor memory can be used with a clock signal having relatively high frequency, without failure.

It is a further object of the present invention to provide a semiconductor memory which can perform a block-write operation without failure regardless of the frequency of a clock signal input thereto.

The semiconductor memory according to the present invention employs a timing signal generator, which generates a first timing signal having a first frequency for an address latch circuit during the normal write operation, and generates a second timing signal having a second frequency lower than the first frequency for the address latch circuit during the block-write operation.

Thus, according to the present invention, the memory performs the normal write operation synchronized with the first timing signal having a relatively high frequency, and performs the block-write operation synchronized with the second timing signal having a relatively low frequency. Therefore, according to the present invention, a memory is provided that can perform the block-writing operation accurately without decreasing the operation speed of the normal write operation.

BRIEF DESCRIPTION OF THE DRAWINGS

The above and other objects, features and advantages of the present invention will be apparent from the following detailed description of various preferred embodiments of the present invention taken in conjunction with the accompanying drawings, in which:

FIG. 6 is a timing chart that explains the operation of the timing signal generator shown in FIG. 4; and FIG. 7 is a timing chart that explains the operation of the timing signal generator shown in FIG. 5.

DETAILED DESCRIPTION OF THE PREFERRED EMBODIMENTS

Figure 1:
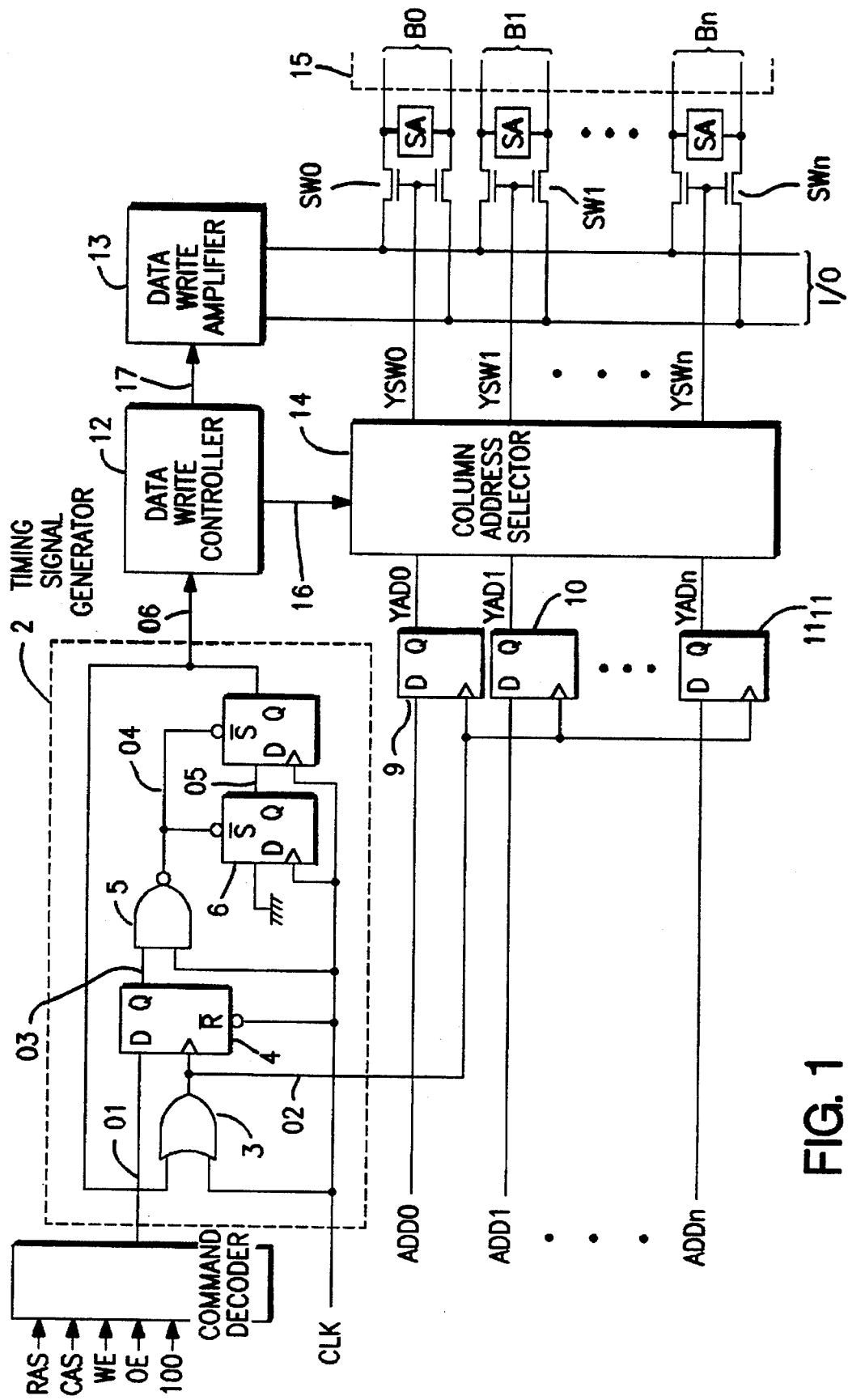
FIG. 1 is a schematic diagram of a semiconductor memory employing a timing signal generator according to a first embodiment of the present invention.

Referring to FIG. 1, the semiconductor memory according to a first embodiment of the present invention includes a timing signal generator 2. The timing signal generator 2 is supplied with a signal φ1 from a command decoder 1 and a clock signal CLK, and supplies a signal φ6 to a data write controller 12 and a signal φ2 to address latch flip-flops (F/Fs) 9–11.

The timing signal generator 2 includes an OR gate 3 generating the signal φ2, a F/F 4 generating a signal φ3, a NAND gate 5 generating a signal φ4 and F/Fs 6 and 7 generating signals φ5 and φ6, respectively. The F/F 4 latches a logic level of the signal φ1 input to a data input D thereof in response to a rising edge of the signal φ2 input to a clock input thereof, and is reset in response to a low level of the clock signal CLK being input to a reset input R thereof. The F/Fs 6 and 7 latch a low level and a high level of the signal φ5, respectively, in response to a rising edge of the clock signal CLK being input to clock inputs thereof, and both of the F/Fs 6 and 7 are set in response to a low level of the signal φ4 being input to set terminals S thereof.

The command decoder 1 generates the signal φ1 in response to a desired signal combination of a row address strobe signal RAS, a column address strobe signal CAS, a write enable signal WE, an output enable signal OE and a special function selection signal 100. In this embodiment, the signal φ1 is generated in response to the aforementioned signal combination as one example, but the invention is not limited as regards how to generate the signal φ1.

The F/Fs 9–11 are supplied with address signals ADD0–ADDn, respectively, and supply Y-address signals YAD0–YADn, respectively, to a column address selection circuit 14. The column address selection circuit 14 is also supplied with a first block-write signal 16 from the data write controller 12. The data write controller 12 generates first and second block-write signals 16 and 17 in response to the signal $\phi 6$. The second block-write signal 17 is supplied to a data write amplifier 13.

Figure 2:
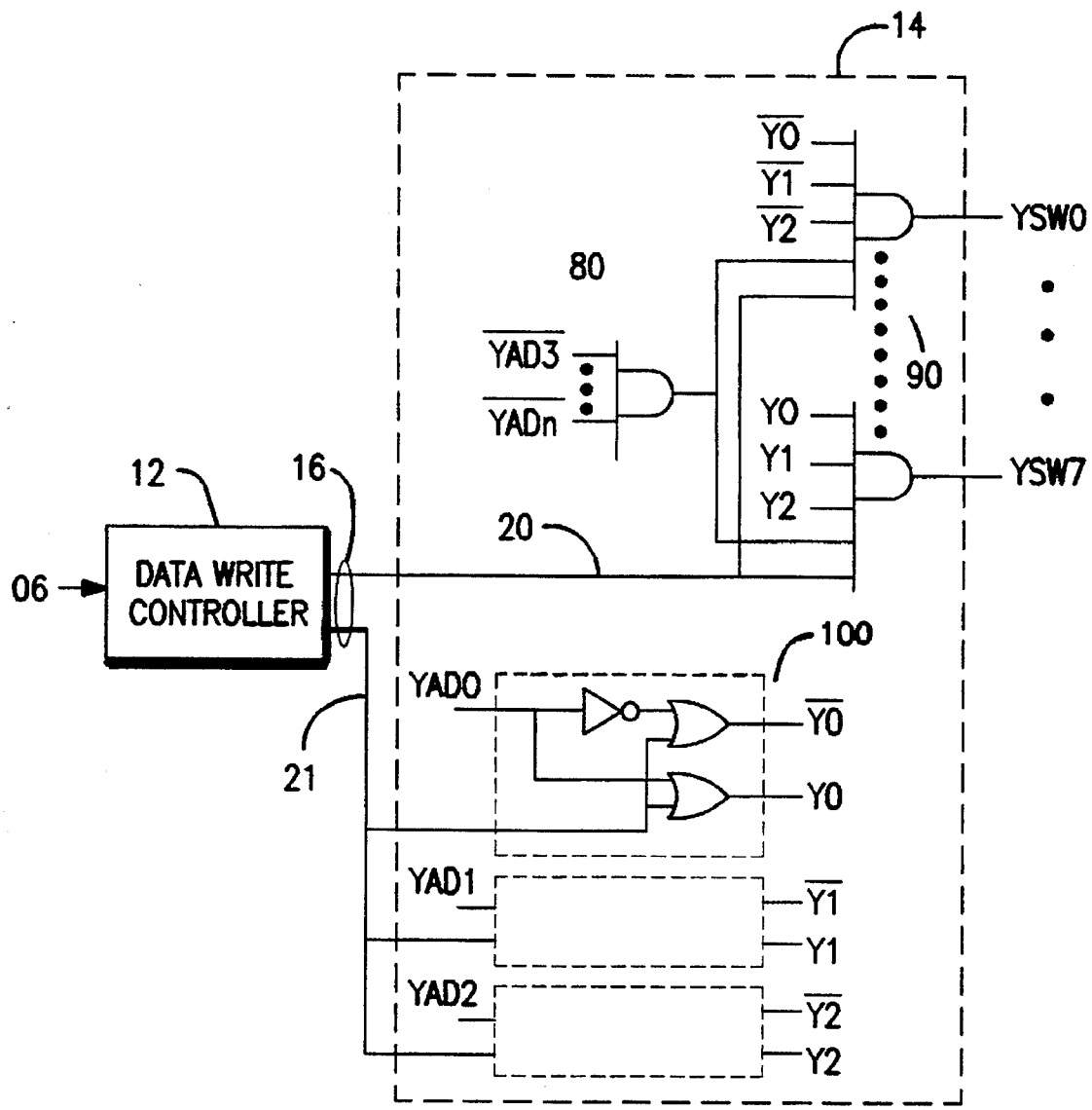
FIG. 2 is a schematic diagram of the column address selection circuit shown in FIG. 1.

Referring to FIG. 2, the column address selection circuit 14 comprises a first AND gate group 80 decoding upper Y-address signals YAD3–YADn, a second AND gate group 90 decoding actual/inverse signals $Y\phi$–$Y2$/$\overline{Y\phi}$–$\overline{Y2}$ made of a lower Y-address signals YAD0–YAD2 and three actual/inverse signal generators 100. As shown in FIG. 2, the first block-write signal 16 comprises signals 20 and 21. The signal 20 enables the second AND gate group 90 to generate Y-switch selection signals YSW0–YSW7 (YSW0–YSWm), and signal 21 changes all the actual/inverse signals of the lower Y-address signals YAD0–YAD2 to high logic level.

That is, when the signal 21 takes low level, the column address selection circuit 14 decodes all of the Y-address signals YAD0–YADn by the first and second AND gates groups 80 and 90 to change one of the Y-switch selection signals YSW0–YSWm to high level. On the contrary, when the signal 21 takes high level, the column address selection circuit 14 decodes only upper Y-address signals YAD3–YADn by the first AND gates group 80 to change eight of the Y-switch selection signals YSW0–YSWm to high level.

Returning to FIG. 1, the Y-switch selection signals YSW0–YSWm are respectively supplied to column switches SW0–SWm each of which is connected between a pair of I/O lines and a corresponding bit line pair B0-Bm. The bit line pairs are connected to a memory cell array 15 shown schematically.

Figure 3:
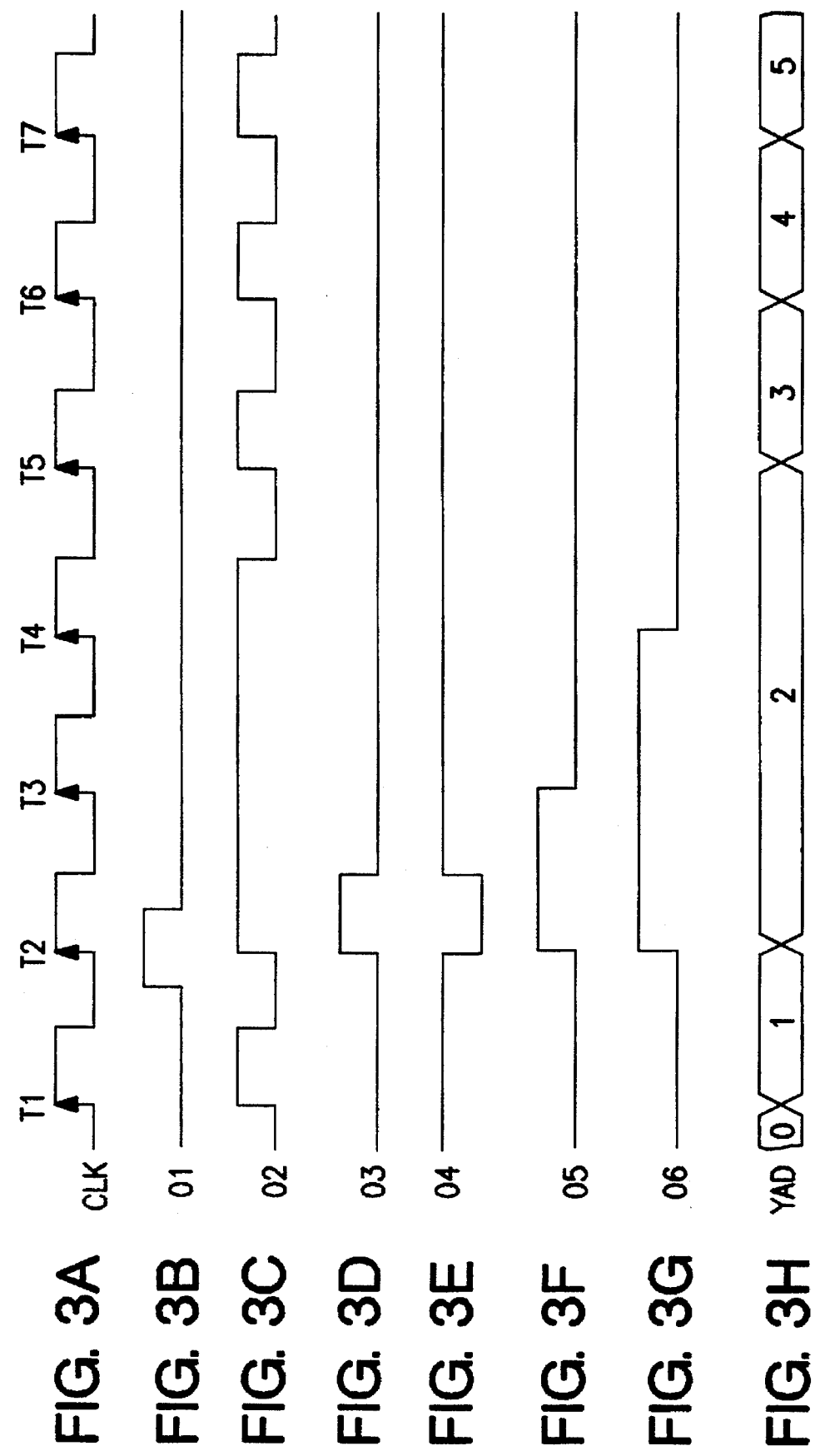
FIG. 3 is a timing chart that explains the operation of the timing signal generator shown in FIG. 1.

The operation of the timing signal generator 2 according to this embodiment will now be explained with reference to FIG. 1 through FIG. 3.

First, when the signal $\phi 1$ is kept at low level because the signal combination input to the command decoder 1 is not of the desired combination, the signal $\phi 6$ is also kept at low level, so that the signal $\phi 2$ from the OR gate 3 is synchronized with the clock signal CLK. Therefore, each of the F/Fs 9–11 latches a corresponding one of the address signals ADD0–ADDn at every rising edge of the clock signal CLK, for example timing T1 in FIG. 3. In this time, the signal 21 from the date write controller 12 is kept at low level. Thus, one of the Y-switch selection signals YSW0–YSWm is activated by the column address selection circuit 14 at every rising edge of the clock signal CLK, so that one of the column switches SW0–SWm is rendered conductive to connect the pair of I/O lines and a selected one of the bit line pairs B0-Bm. That is, when the signal $\phi 1$ is kept at low level, one of the bit line pairs B0-Bm is connected to the pair of I/O lines to read/write data from/into a selected memory cell at every rising edge of the clock signal CLK.

Next, when the signal $\phi 1$ goes high at the rising edge of the clock signal CLK (referring to time T2 in FIG. 3) so as to perform the block-write operation, due to the signal combination input to the command decoder 1 taking the desired combination, the signal $\phi 3$ changes from low level to high level at the rising edge of the clock signal CLK (T2). Therefore, the signal $\phi 4$ changes from high level to low level at this time, so that the F/Fs 6 and 7 are set to output signals $\phi 5$ and $\phi 6$ of high level. At the next rising edge of the clock signal CLK (T3), the F/F 6 latches low level to output the signal $\phi 5$ of high level, but the F/F 7 continues to output the signal $\phi 6$ of high level until the next rising edge (T4). Thus, the signal $\phi 2$ is kept at high level until a falling edge coming after the rising edge T4, as shown in FIG. 3. That is, each of the F/Fs 9–11 keeps the address signal, each of which is latched at the rising edge T2 of the clock signal CLK, during a period from the rising edge T2 to the rising edge T5.

On the other hand, the signal $\phi 6$ of high level is supplied to the data write controller 12, so that the signal 21 (FIG. 2) is activated. Therefore, the column address selection circuit 14 activates eight of the Y-switch selection signals YSW0–YSWm to high level based on the upper Y-address signals YAD3–YADn. Thus, eight of the column switches SW0–SWm are rendered conductive simultaneously to connect the pair of I/O lines and eight of the bit line pairs B0-Bm.

That is, when the signal $\phi 2$ takes high level, eight of the bit line pairs B0-Bm, which have the same upper Y-address, are connected to the pair of I/O lines to write data into eight memory cells simultaneously, so that the block-write is performed.

As mentioned above, although the block-write operation requires more time compared with a normal write operation, the semiconductor memory employing the timing signal generator 2 according to this embodiment holds the address signals ADD0–ADDn over three clock cycles. Therefore, even if the frequency of the clock signal CLK increases to shorten the cycle time of the normal write operation, the block-write operation is accurately performed because three clock cycles are employed during the block-write operation.

Next, a second embodiment according to the present invention will be explained with reference to FIG. 4 and FIG. 6. This embodiment is applied to a memory having a two bank construction.

Figure 4:
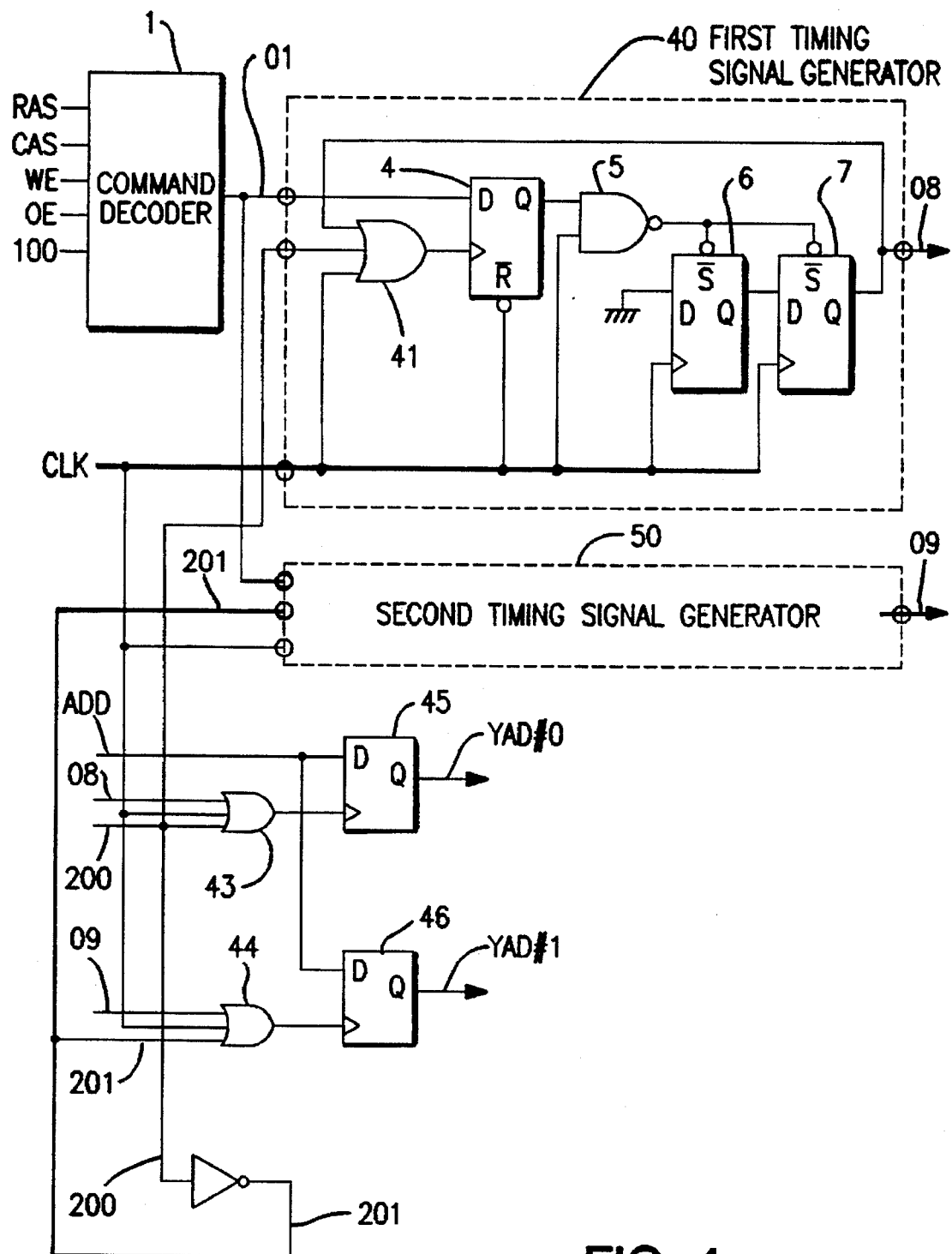
FIG. 4 is a schematic diagram of a semiconductor memory employing a timing signal generator according to a second embodiment of the present invention.

Referring to FIG. 4, a first timing signal generator 40 according to this embodiment includes an OR gate 41 in place of the OR gate 3 of the first embodiment. The construction of the timing signal generator 40 is otherwise the same as the construction of the timing signal generator 2. A second timing signal generator 50 has the same construction as the first timing signal generator 40.

The first and second timing signal generators 40 and 50 generate signals $\phi 8$ and $\phi 9$, respectively, which are supplied to OR gates 43 and 44, respectively. The OR gate 43 is also supplied with the clock signal CLK and a bank selection signal 200, and the OR gate 44 is also supplied with the clock signal CLK and an inverted bank selection signal 201.

Although the address signals comprise a plurality of digits similar to the first embodiment, only one digit ADD is shown in FIG. 4 to facilitate an understanding of this embodiment. Similarly, although each of F/Fs for the bank #0 and bank #1 comprises a plurality of F/Fs, only one F/F 45 or 46 for each bank is shown in FIG. 4. Moreover, downstream circuits such as the data write controller, data write amplifier and column address selection circuit and memory cell array are omitted in FIG. 4 because each bank #0 and #1 has the same construction as the first embodiment.

The operation of the semiconductor memory according to this embodiment employing the timing signal generators 40 and 50 will now be explained.

As shown in FIG. 6, signal $\phi 1$ takes high level at the rising edge T1 of the clock signal CLK because the signal combination input to the command decoder 1 takes the desired combination, thereby to perform the block-write operation. The signal $\phi 8$ thus changes from low level to high level until the rising edge T3 of the clock signal CLK because the bank selection signal 200 takes low level at T1. Therefore, the block-write operation is performed to the bank #0 while the Y-address signals YAD#0 for the bank #0 are held by the F/F 45 until the rising edge T4 of the clock signal CLK.

Subsequently, when the signal φ1 takes high level again at the rising edge T2 of the clock signal CLK, the signal φ9 changes from low level to high level until the rising edge T4 of the clock signal CLK, because the inverted bank selection signal 201 takes low level at T2. Therefore, the block-write operation is performed to the bank #1 while the Y-address signals YAD#1 for the bank #1 are held by the F/F 46 until the rising edge T5 of the clock signal CLK regardless of the operation of the bank #0.

Thus, according to this embodiment, not only is the block-write operation accurately performed, but also the block-write operation is performed for both of banks #0 and #1 independently each other, so that the write operation can be performed more quickly.

In the first and second embodiments, although a three clock cycle time is used during the block-write operation, it is apparent that the present invention is not limited to such cycle time. That is, it could be that two, four, five or more clock cycles are used for the block-write operation.

Next, a third embodiment according to the present invention will be explained with reference to FIG. 5 and FIG. 7. This embodiment is also applied to a memory having a two bank construction.

Figure 5:
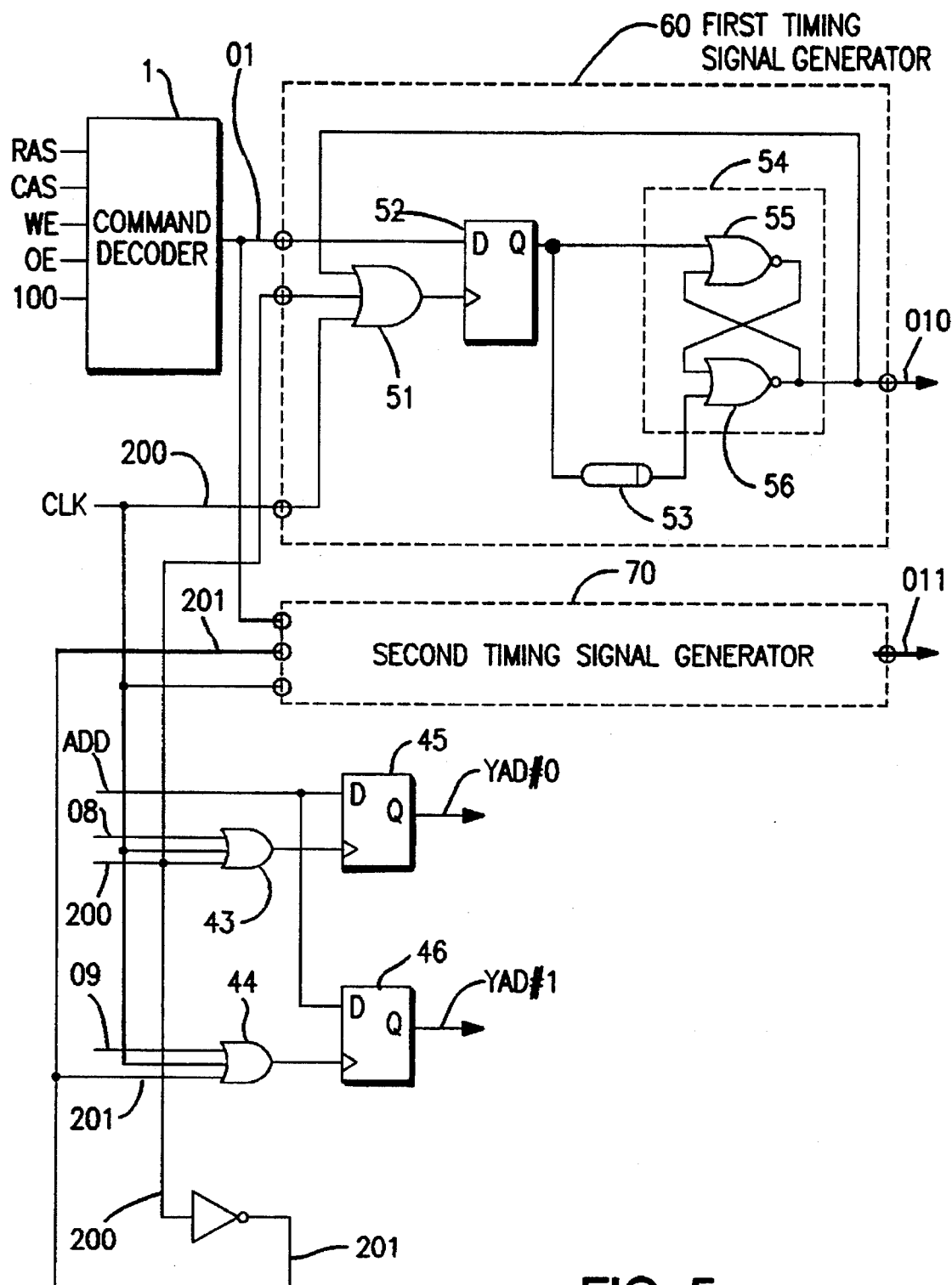
FIG. 5 is a schematic diagram of a semiconductor memory employing a timing signal generator according to a third embodiment of the present invention.

Referring to FIG. 5, a first timing signal generator 60 includes an OR gate 51, a F/F 52, a delay circuit 53 and a RS-F/F 54 which has two NOR gates 55 and 56. A second timing signal generator 70 has the same construction as the first timing signal generator 60. The construction of the memory according to this embodiment is otherwise the same as the second embodiment.

Each of the timing signal generators 60 and 70 operates similarly as the timing signal generator 40 or 50 of the second embodiment. That is, when the F/F 52 latches high level, the RS-F/F 54 is set to output a signal φ10 of high level because one input of the NOR gate 55 is supplied with a signal of high level, and thereafter, the RS-F/F 54 is reset to output a signal φ10 of low level again because one input of the NOR gate 56 is supplied with a signal of high level from the delay circuit 53.

The operation of the semiconductor memory employing the timing signal generators 60 and 70 according to this embodiment will now be explained.

As shown in FIG. 7, when the signal φ1 takes high level at the rising edge T1 of the clock signal CLK while the bank selection signal 200 takes low level, the signal φ10 changes from low level to high level during a delay time of the delay circuit 53. Therefore, the block-write is performed to the bank #0 while the Y-address signals YAD#0 for the bank #0 are held by the F/F 45 until the RS-F/F 54 is reset.

Subsequently, when the signal φ1 takes high level again at the rising edge T2 of the clock signal CLK while the inverted bank selection signal 201 takes low level, the signal 411 changes from low level to high level during a delay time of the delay circuit employed in the timing signal generators 70. Therefore, the block-write is performed to the bank #1 while the Y-address signals YAD#1 for the bank #1 are held by the F/F 46 until the RS-F/F employed into the timing signal generators 70 is reset.

The advantage of this embodiment is that, since the processing time for the block-write operation is set to the delay time of the delay circuit 53, the frequency of the clock signal CLK can be chosen regardless of the required processing time for the block-write operation.

For example, it is assumed that the clock cycle (period between each rising edge of the clock signal) is 20 ns and the required processing time for the block-write operation is 30 ns. An actual processing time for block-write operation takes 60 ns in the first or second embodiment because each block-write operation spends three clock cycle, whereas in this embodiment, an actual processing time for block-write operation takes only 30 ns when the delay time of the delay circuit 53 is set to 30 ns.

Furthermore, in above-mentioned example, although the clock cycle of up to 10 ns is required in the first or second embodiment, a shorter clock signal, such as 5 ns, can be applied in this embodiment when the delay time of the delay circuit 53 is set to 30 ns. Thus, the processing time is shortened, and a faster block-write processing is achieved.

It is apparent that the present invention is not limited to the above embodiments but may be changed and modified without departing from the scope and spirit of the invention.

What is claimed is:

1. A semiconductor memory comprising:
    a memory cell array having a plurality of bit lines;
    a I/O line;
    a plurality of column switches, each of said column switches being connected between said I/O line and a corresponding one of said bit lines;
    a timing signal generator supplied with a clock signal having a first cycle time and a control signal, said timing signal generator generating a timing signal synchronized with said clock signal when said control signal has a first logic level, and generating a timing signal having a second cycle time longer than said first cycle time when said control signal has a second logic level different from said first logic level;
    an address latch circuit which latches an address signal in response to said timing signal; and
    a column decoder decoding said address signal latched into said address latch circuit to activate at least one of said column switches.

2. The semiconductor memory as claimed in claim 1, wherein said second cycle time is an integral multiple of said first cycle time.

3. The semiconductor memory as claimed in claim 1, wherein said timing signal generator includes a delay circuit having a delay time, said second cycle time being equal to said delay time.

4. The semiconductor memory as claimed in claim 1, wherein said column decoder activates one of said column switches based on said address signal latched into said address latch circuit when said timing signal is synchronized with said clock signal, and said column decoder activates a plurality of said column switch based on said address signal latched into said address latch circuit when said timing signal has said second cycle time.

5. The semiconductor memory as claimed in claim 4, wherein said column decoder activates a plurality of said column switch based on upper digits of said address signal latched into said address latch circuit when said timing signal has said second cycle time.

6. A semiconductor memory having first and second banks comprising:
    a first timing signal generator generating a first timing signal based on a control signal and being inactivated in response to a first bank selection signal;
    a second timing signal generator generating a second timing signal based on said control signal and being inactivated in response to a second bank selection signal;

first means for generating a third timing signal based on said first timing signal and being inactivated in response to said first bank selection signal;

second means for generating a fourth timing signal based on said second timing signal and being inactivated in response to said second bank selection signal;

a first address latch circuit latching an address signal in response to said third timing signal and outputting a first internal address for said first bank; and a second address latch circuit latching said address signal in response to said fourth timing signal and outputting a second internal address for said second bank.

7. The semiconductor memory as claimed in claim 6, wherein said first means has a first logic gate receiving said first timing signal, first bank selection signal and a clock signal, and outputting said third timing signal; and said second means has a second logic gate receiving said second timing signal, second bank selection signal and said clock signal, and outputting said fourth timing signal.

8. The semiconductor memory as claimed in claim 7, wherein said first timing signal generator generates said first timing signal having a first active period based on said control signal and said clock signal and being inactivated in response to said first bank selection signal, said second timing signal generator generating said second timing signal having a second active period based on said control signal and said clock signal and being inactivated in response to said second bank selection signal, each of said first and second active periods being longer than a clock cycle of said clock signal.

9. A semiconductor memory comprising a plurality of memory cells, a timing signal generator generating a first timing signal having a first frequency during an individual memory cell write operation, said timing signal generator generating a second timing signal having a second frequency lower than said first frequency during a block-write operation, an address latch circuit latching an address signal in response to said first timing signal during said individual memory cell write operation, said address latch circuit latching said address signal in response to said second timing signal during said block-write operation; and a decoder circuit decoding said address signal latched into said address latch circuit to write data into at least one of said memory cells.

* * * * *